(12) United States Patent
Stave et al.

(10) Patent No.: US 11,508,422 B2
(45) Date of Patent: Nov. 22, 2022

(54) METHODS FOR MEMORY POWER MANAGEMENT AND MEMORY DEVICES AND SYSTEMS EMPLOYING THE SAME

(71) Applicant: Micron Technology, Inc., Boise, ID (US)

(72) Inventors: Eric J. Stave, Meridian, ID (US); George E. Pax, Boise, ID (US); Yogesh Sharma, Boise, ID (US); Gregory A. King, Hastings, MN (US); Chan H. Yoo, Boise, ID (US); Randon K. Richards, Kuna, ID (US); Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/530,739

(22) Filed: Aug. 2, 2019

(65) Prior Publication Data
US 2021/0035617 A1  Feb. 4, 2021

(51) Int. Cl.
*G11C 7/22* (2006.01)
*G11C 16/10* (2006.01)
*G11C 7/10* (2006.01)

(52) U.S. Cl.
CPC ............ *G11C 7/222* (2013.01); *G11C 7/1072* (2013.01); *G11C 7/1093* (2013.01); *G11C 16/10* (2013.01)

(58) Field of Classification Search
CPC ..... G11C 7/222; G11C 7/1072; G11C 7/1093; G11C 16/10
See application file for complete search history.

(56) References Cited

U.S. PATENT DOCUMENTS

| | | | | | |
|---|---|---|---|---|---|
| 4,533,994 | A | * | 8/1985 | Harrill | G06F 13/26 710/40 |
| 4,630,239 | A | * | 12/1986 | Reed | G11C 8/18 365/233.5 |
| 5,524,096 | A | * | 6/1996 | Roohparvar | G11C 8/18 365/194 |
| 5,668,769 | A | * | 9/1997 | Coffman | G11C 7/22 365/226 |
| 6,618,791 | B1 | * | 9/2003 | Dodd | G06F 1/3225 711/105 |
| 7,796,461 | B2 | * | 9/2010 | Kawaguchi | G11C 5/02 365/230.01 |

(Continued)

*Primary Examiner* — Khamdan N. Alrobaie
(74) *Attorney, Agent, or Firm* — Perkins Coie LLP

(57) ABSTRACT

Systems, apparatuses, and methods for operating a memory device or devices are described. A memory device or module may introduce latency in commands to coordinate operations at the device or to improve timing or power consumption at the device. For example, a host may issue a command to a memory module, and a component or feature of the memory module may receive the command and modify the command or the timing of its execution in manner that is invisible or non-disruptive to the host while facilitating operations at the memory module. In some examples, components or features of a memory module may be disabled to effect or introduce latency in operation without affecting timing or operation of a host device. A memory module may operate in different modes that allow for different latencies; the use or introduction of latencies may not affect other features or operability of the memory module.

13 Claims, 5 Drawing Sheets

(56) References Cited

U.S. PATENT DOCUMENTS

| | | | | |
|---|---|---|---|---|
| 2008/0079469 A1* | 4/2008 | Cho | ............ | H03L 7/0812 |
| | | | | 327/158 |
| 2012/0314522 A1* | 12/2012 | Balluchi | ............ | G11C 7/22 |
| | | | | 365/227 |
| 2013/0191558 A1* | 7/2013 | Zitlaw | ............ | G06F 9/44 |
| | | | | 710/52 |
| 2018/0374532 A1* | 12/2018 | Kondo | ............ | G11C 11/4063 |
| 2019/0074040 A1* | 3/2019 | Mentovich | ............ | G11C 8/08 |

* cited by examiner

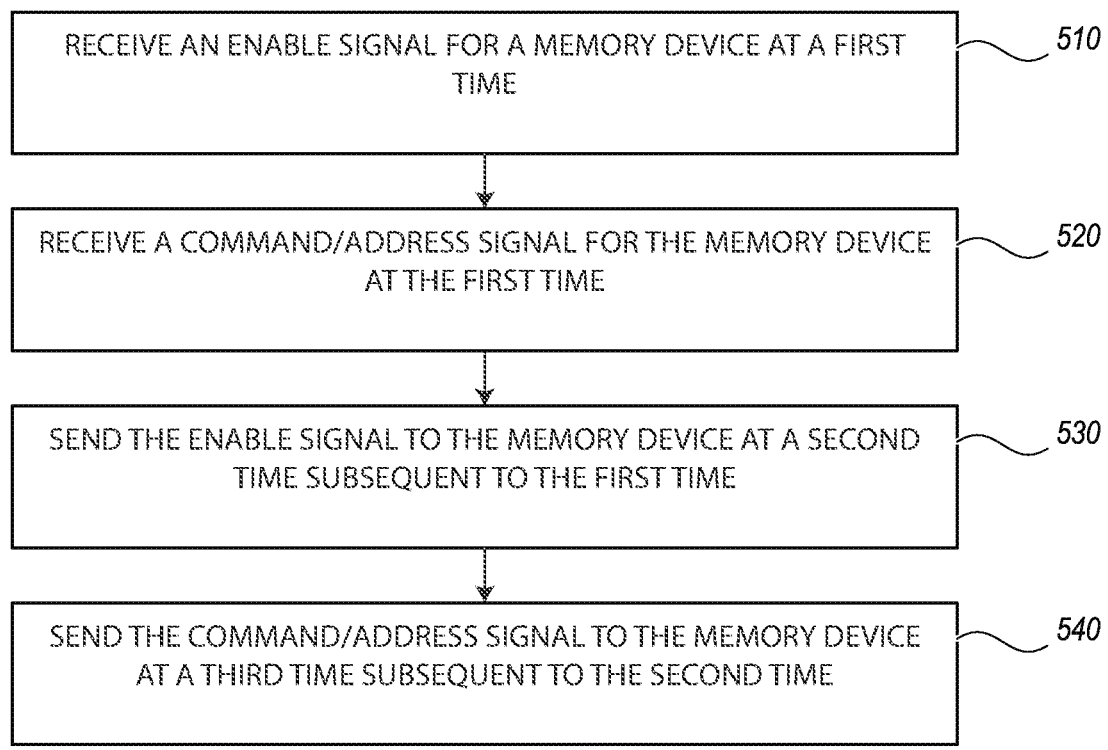

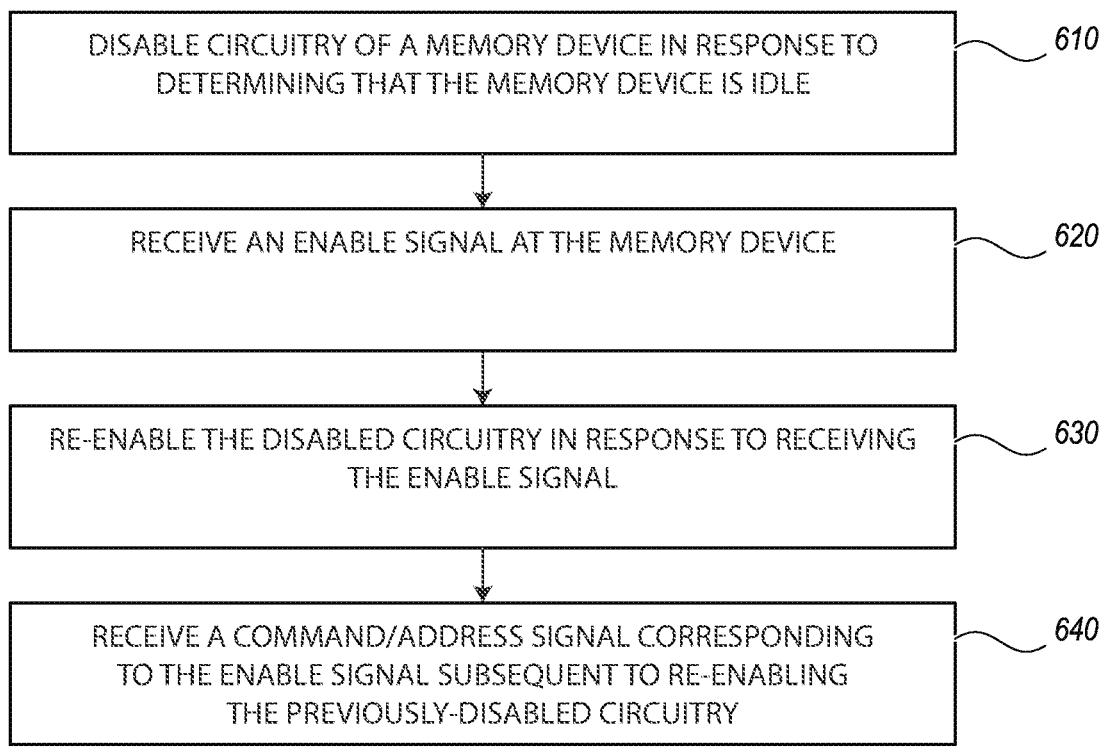

METHODS FOR MEMORY POWER MANAGEMENT AND MEMORY DEVICES AND SYSTEMS EMPLOYING THE SAME

TECHNICAL FIELD

The present disclosure generally relates to methods for memory power management, and memory devices and systems employing the same.

BACKGROUND

Memory devices are widely used to store information related to various electronic devices such as computers, wireless communication devices, cameras, digital displays, and the like. Information is stored by programming different states of a memory cell. Various types of memory devices exist, including magnetic hard disks, random access memory (RAM), read only memory (ROM), static RAM (SRAM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

FIG. 5 is a flow chart illustrating a method of operating a memory system in accordance with an embodiment of the present technology.

FIG. 6 is a flow chart illustrating a method of operating a memory device in accordance with an embodiment of the present technology.

DETAILED DESCRIPTION

Memory devices are frequently used in applications where power consumption is an important consideration, such as in battery-powered mobile devices. Accordingly, reducing the power consumed by a memory device can provide a number of advantages such as longer battery life, increased speed, etc. For example, in a memory module including multiple separately-addressable memory devices, the power consumed by memory devices not actively communicating (e.g., reading or writing) data may represent a significant contribution to the total power budget of the memory module, such that a reduction in the power consumed by these devices could provide a significant increase in the battery life of the host device thereof.

One approach to reducing the power consumed by a memory device involves disabling at least some of the circuitry of the memory device when circumstances permit. For example, by disabling the input buffer on a memory device when the memory device is not receiving, e.g., command/address information, the power that would otherwise be consumed by the idle circuitry can be saved. The drawback to this approach, however, is the delay experienced when re-enabling the disabled circuitry, a delay which can cause unacceptable performance degradation (e.g., in a deterministic memory, failing to execute a command in the predetermined timeframe).

Accordingly, several embodiments of the present technology are directed to memory devices, systems including memory devices, and methods of operating memory devices in which some circuitry of a memory device can be disabled when idle, and which can be re-enabled without experiencing an unacceptable delay by sending the memory device an enable signal in advance of other signals (e.g., command/address signals). In one embodiment, a method of operating a memory module including a memory device comprises receiving an enable signal for the memory device at a first time, receiving a command/address signal for the memory device at the first time, sending the enable signal to the memory device at a second time subsequent to the first time, and sending the command/address signal to the memory device at a third time subsequent to the second time. In response to the enable signal, the memory device can re-enable previously-disabled circuitry (e.g., an input buffer) in time to receive and appropriately respond to the command/address signal.

Figure 1:
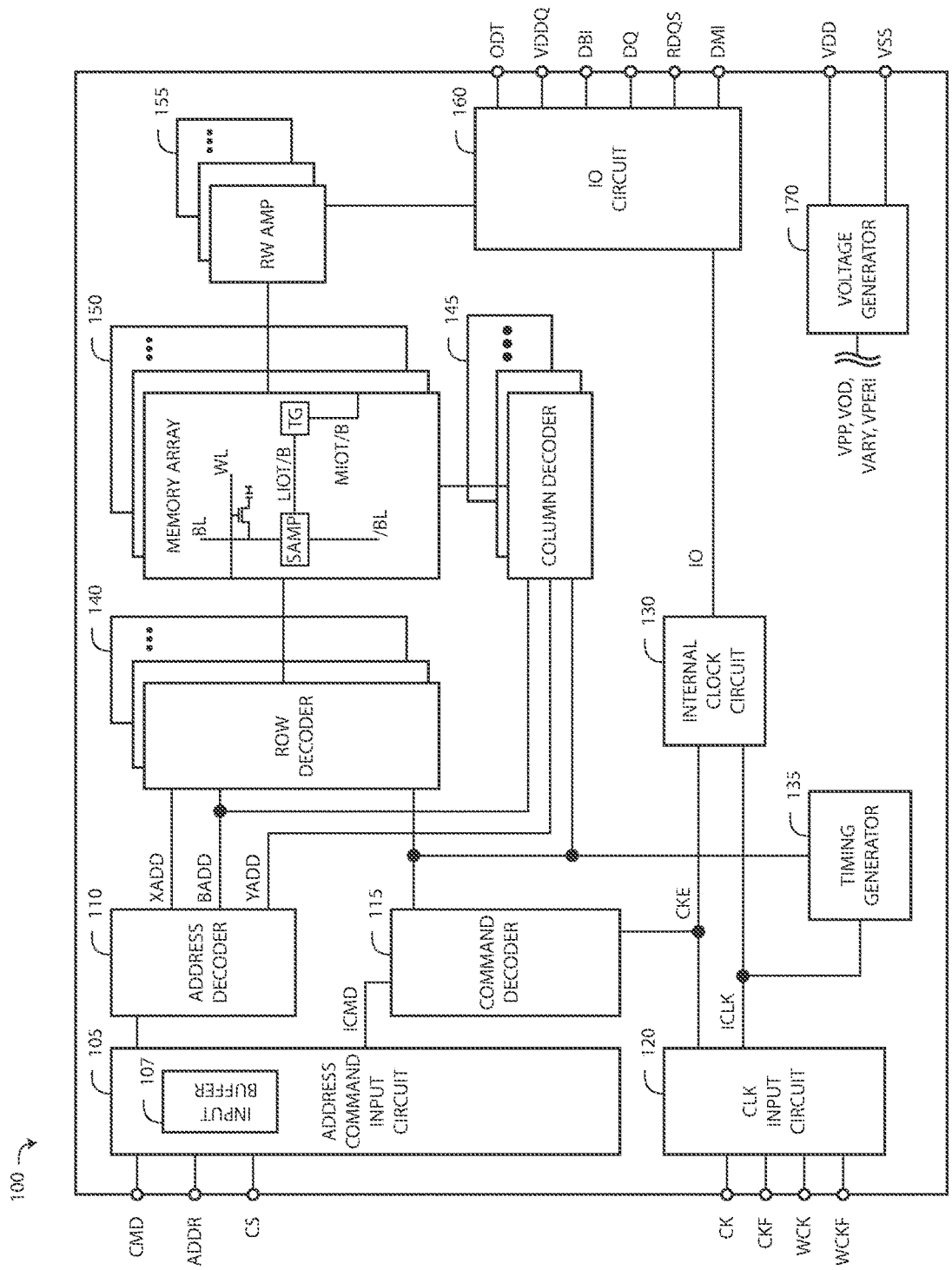
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

One approach to reducing the power consumption of a memory device can involve disabling at least a portion of the circuitry of the memory device when that circuitry and/or the memory device is idle. For example, in one embodiment of the present disclosure, at least the input buffer 107 of the input circuit 105 of memory device 100 can be disabled when the memory device 100 is not receiving command/address signals, and re-enabled in response to an enable signal (e.g., a chip select (CS) signal received at a chip select terminal) received from, e.g., a memory controller, a registering clock driver (RCD), or the like.

In some memory devices, a CS signal is generally expected to be received concurrently with a command/address signal (e.g., concurrently with the first clock cycle of a command/address signal having a duration of one or more clock cycles). When the CS signal is driven low, a command/address input circuit is configured to provide command/address signals received concurrently with the CS signal to a command/address decoder. Accordingly, in such a memory device, disabling an input buffer of the command/address input circuit would prevent proper operation, as the memory device would not have time, in response to receiving the CS signal, to re-enable the input buffer to receive the concurrent command/address signals.

According to one aspect of the present disclosure, the memory device 100 can be configured to disable at least an input buffer of the input circuit 105 when idle, and to re-enable the disabled circuitry in response to the receipt of a CS signal provided to the memory device in advance of, rather than concurrently with, the command/address signal. When so configured, the memory device can have sufficient time (e.g., one or more clock cycles) to re-enable the disabled circuitry before receipt of the command/address signal. To enable this configuration, the CS signal and command/address signal, which would conventionally be sent concurrently (e.g., with the first clock cycle of a command/address signal having a duration of one or more clock cycles sent concurrently with the CS signal), would be sent to the memory device in a staggered fashion (e.g., with the command/address signal delayed by one or more clock cycles from the CS signal). In various embodiments of the present invention, the sender of these staggered signals may variously be a registering clock driver (RCD) of a memory module, a memory controller, or even a host device. The power savings from operating the memory device in this fashion can be significant, and more especially so in a memory module in which multiple memory devices so configured are provided. A simplified block diagram of one such memory module 200 is illustrated in FIG. 2, in accordance with an embodiment of the present technology.

Figure 2:
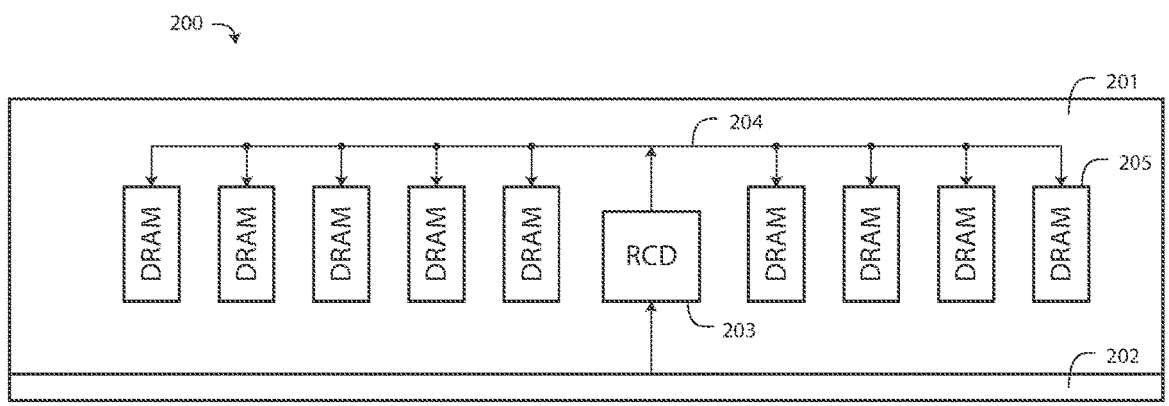
FIG. 2 is a simplified block diagram schematically illustrating a memory module in accordance with an embodiment of the present technology.

As illustrated in FIG. 2, the memory module 200 (e.g., a dual in-line memory module (DIMM)) includes a module substrate 201 at one edge of which is a connector 202. Signals received at the connector 202, such as CS signals and command/address signals, can be provided to a registering clock driver (RCD) 203, which can re-drive the signals over a command/address bus 204 to each of a plurality of DRAM devices 205. The memory module 200 can also include a data bus (not illustrated) for transmitting data signals between the connector 202 and the DRAM devices 205. Unlike a conventional RCD, which is configured to re-drive signals with a fixed delay regardless of the type of signal, the RCD 203 can be configured to additionally delay the re-driving of command/address signals that are received concurrently with an enable (e.g., CS) signal to the memory devices, to provide sufficient time for the memory devices to re-enable previously-disabled circuitry before the arrival of the command/address signals. The additional delay may have a duration corresponding to one or more clock cycles of the memory device(s) to which the signals are sent. According to one aspect of the present disclosure, the delay may be configurable (e.g., stored in a user-editable mode register of the RCD) to accommodate disabling and re-enabling different circuitry on the memory devices (e.g., having different re-enabling durations) or to accommodate the use of a single RCD in various memory modules or packages.

Figure 3:
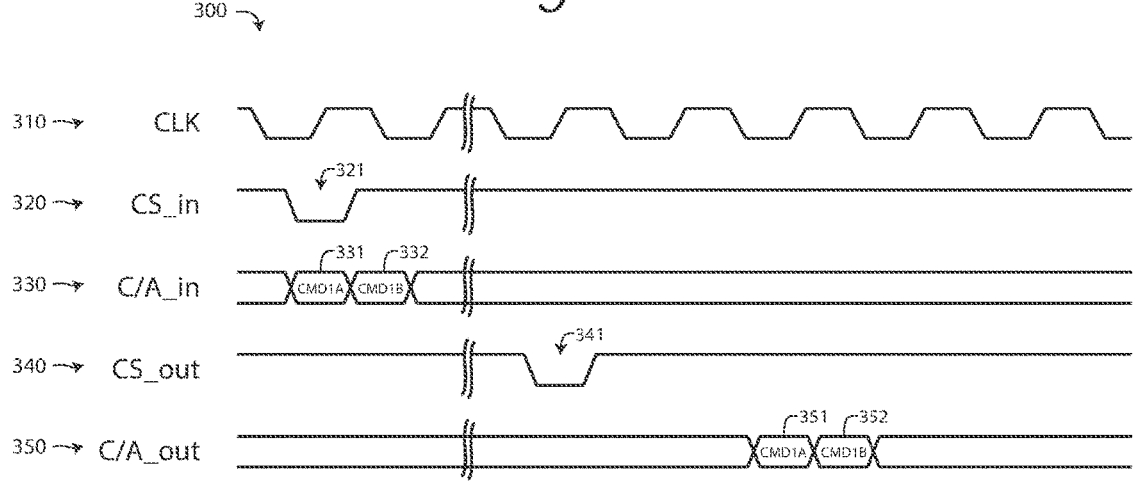
FIG. 3 is a simplified timing diagram illustrating a method for memory power management in accordance with embodiments of the present technology.

The staggered re-driving of concurrently-received enable (e.g., CS) and command/address signals may be better understood with reference to FIG. 3, in which a simplified timing diagram 300 illustrating a method for memory power management is provided in accordance with various embodiments of the present technology. A clock signal (CLK) 310 is provided to the memory module 200, and distributed via a clock tree (not illustrated) to the RCD and the DRAM devices 205. At a first time, a concurrent CS signal 321 and a command/address signal (comprising command/address signal CMD1A 331 and command/address signal CMD1$b$ 332) are provided to the RCD 203 via a CS_in line 320 and a C/A_in line 330, respectively. The CS signal 321 is re-driven by the RCD 203 after a short delay at a second time as CS signal 341 via a CS_out line 340 to the DRAM devices 205. The command/address signals 331 and 332 are re-driven by the RCD 203 at a subsequent third time (e.g., corresponding to a delay of two clock cycles in the illustrated embodiment) to the DRAM devices 205 as command/address signal 351 and 352 via a C/A_out line 350. In the two-clock-cycle delay between the re-driven CS signal 341 and the re-driven command/address signals 351 and 352, the input buffer of the DRAM device 205 targeted by the CS signal 341 is configured to be re-enabled, in sufficient time to receive the command/address signals 351 and 352.

The delay between the second time (at which the CS signal is re-driven) and the third time (at which the command/address signals are subsequently re-driven), although illustrated as two clock cycles of the clock signal 310, can in other embodiments of the present disclosure have different durations (e.g., corresponding to different numbers of clock cycles, such as one, three, four, etc., or even to non-integer numbers of clock cycles such as 0.5, 1.5, 2.5, etc.). The duration may be configured during the manufacture of the memory module 200, and/or may be configurable by an end user (e.g., by sending a vendor specific command to the memory module and storing a delay in one or more mode registers of the memory module 200, the RCD 203, and/or the DRAM devices 205). The duration can be chosen based upon the delay in re-enabling the disabled circuitry of the DRAM devices 205 (e.g., a longer duration for circuitry that takes more time to re-enable).

For some types of memory that are expected to behave deterministically in response to commands (e.g., DRAM), a further aspect of the present disclosure involves offsetting a latency of the memory devices in view of the delay between re-driving the enable signal and re-driving the command/address signal. For example, the DRAM devices 205 on the memory module 200 may be configured by a host device (e.g., upon powering on or resetting the device) to operate with specified read and write latency values, expressed in a number of clock cycles of the memory device. When the DRAM devices 205 are configured to manage their power as set forth above, the additional delay in the receipt of the re-driven command/address signals from the RCD 203 can be accommodated by offsetting the programmed latency value by a duration corresponding to that delay. In one example, where the DRAM devices 205 are configured with read and write latencies of five clock cycles each, and the RCD 203 is configured to re-drive command/address signals two clock cycles after re-driving the CS signal, the DRAM devices can be configured to behave as though their programmed latencies were for three clock cycles (e.g., the originally programmed amount offset by the RCD-introduced delay). With this arrangement, the delay introduced by the RCD when re-driving the command/address signals can be accommodated (e.g., data output in response to the command/address signals will appear on the data bus at the clock cycle expected by the host device).

Because DRAM devices are frequently operated at or near their maximum latencies, such that internally offsetting the latency of a DRAM device would not be feasible, it may be beneficial in some embodiments of the present disclosure for a memory module of memory devices configured with power management according to the foregoing approach to be configured by a host device to operate with relaxed latencies. In this regard, for a memory device which can operate with a minimum read and write latency of five clock cycles, to provide a power management approach in which the RCD will introduce a further two clock cycle delay when re-driving command/address signals the host may be configured to specify read and write latency values (e.g., at device power-on or reset) of at least two clock cycles greater than the minimum latencies of the memory devices (e.g., with at least seven clock cycles of read and write latency). Accordingly, the benefits of the foregoing power management approach may be considered to come at a cost of increased latency (e.g., a cost of operating the memory devices at latencies greater than the minimum latencies at which they might otherwise be operated), at least for those memories expected to behave deterministically.

In accordance with one aspect of the present disclosure, the foregoing approach to power management can be enabled or disabled by an end user of the memory device and/or memory modules. For example, in an embodiment in which the delay between re-driving an enable signal and re-driving command/address signals is configurable, the power management features may be disabled by configuring the delay to a value of 0. In response to detecting this configuration, the memory devices can be configured to cease disabling idle circuitry, such that the concurrent arrival at a memory device of an enable signal and command/address signals can be accommodated by circuitry which has not been disabled. Other approaches to enabling and disabling the foregoing power management features may also be used, such as providing an enable flag in a mode register, sending a command to the memory device, or the like.

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc. Moreover, although memory modules have been illustrated and described as dual in-line memory modules (DIMMs) having nine memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.).

Further, although the delay of command/address signals relative to concurrently-received enable signals has been described and illustrated as being performed with a RCD, in other embodiments of the present disclosure, other circuits and devices can be used to provide this functionality. For example, a dedicated delay circuit within a memory device can be used to introduce a delay between the receipt of an enable signal and the receipt (e.g., at an input buffer thereof) of a command/address signal. Alternatively, a memory module can include circuitry for delaying (e.g., without re-driving) a command/address signal en route to a memory device to accomplish the same delay as might otherwise be provided by an RCD. Still further, a memory controller (e.g., in a memory package, on a memory module, or completely physically separate from the memory devices) can be configured to provide similar functionality.

Although in the foregoing example embodiments, memory devices have been described as disabling their input buffers in response to a determination that the memory device is idle, in other embodiments of the present disclosure, other and/or additional circuitry of a memory device could be similarly disabled in a similar fashion. For example, delay locked loop (DLL) circuitry, output buffers, portions of a clock tree, etc. could also or alternatively be disabled when idle, and re-enabled in response to receiving an enable (e.g. CS) signal.

According to one aspect of the present technology, a memory device may be configured to detect when it is idle in any one of a number of ways known to those of skill in the art. For example, in one embodiment, a memory device may be configured to determine that it is idle when the command/address input circuit is not receiving signals, and the data bus is likewise not communicating. In another embodiment, a memory device may be configured to determine that it is idle after a predetermined number of clock cycles have elapsed since the last command received by the memory device. In yet another embodiment, a memory device may be configured to determine that it is idle in response to receiving a predetermined command or signal (e.g., from an operably-connected host device), such as a read or write command that included an indication that subsequent commands will be delayed (e.g., with a flag or bit indicating that the memory device should enter an idle mode), or in response to a post-amble condition that could be configured to specify that a subsequent command burst will be delayed. Still other approaches to determining an idle condition may be used, in keeping with various embodiments of the present technology.

Figure 4:
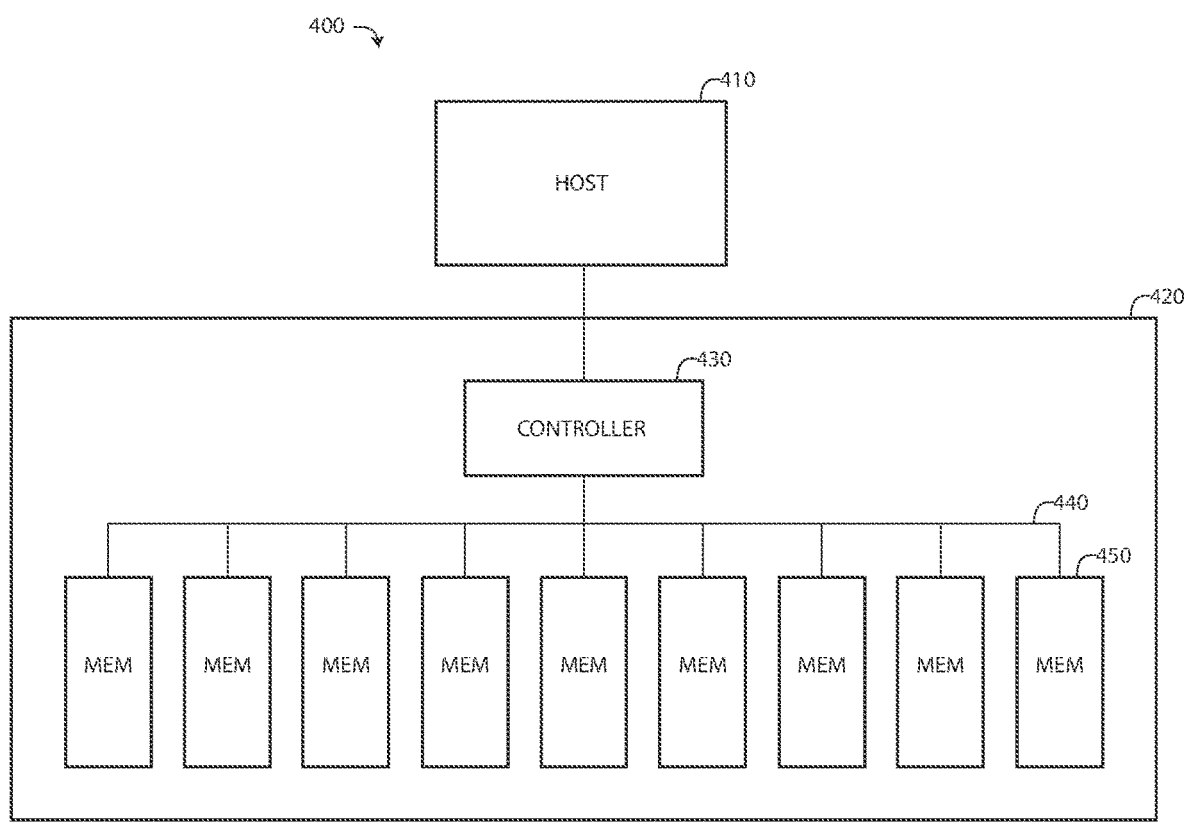
FIG. 4 is a simplified block diagram schematically illustrating a memory system in accordance with an embodiment of the present technology.

FIG. 4 is a simplified block diagram schematically illustrating a memory system 400 in accordance with an embodiment of the present technology. Memory system 400 includes a host device 410 operably coupled to a memory module 420 (e.g., a dual in-line memory module (DIMM)). Memory module 420 can include a controller 430 operably connected by a bus 440 to a plurality of memory devices 450. In accordance with one aspect of the present disclosure, the controller 430 can introduce a delay when re-driving or otherwise transmitting concurrently-received enable (e.g., CS) and command/address signals, to provide the memory devices 450 sufficient time to re-enable previously-disabled circuitry in response to receiving the enable signal and prior to receiving the command/address signal, as set forth above in greater detail. In accordance with another aspect of the present disclosure, the foregoing power management approach can be performed transparently to the host device 410 (e.g., the memory devices 450 can offset a latency provided by the host 410 by a duration corresponding to the introduced delay, so that data read from the memory devices is provided on a data bus at a time expected by the host 410).

FIG. 5 is a flow chart illustrating a method of operating a memory system (e.g., a memory module including one or more memory devices) in accordance with an embodiment of the present technology. The method includes receiving an enable signal for the memory device at a first time (box 510). According to one aspect of the present disclosure, the receiving features of box 510 may be implemented with the command/address input circuit 105, as illustrated in FIG. 1 in greater detail, above. The method further includes receiving a command/address signal for the memory device at the first time (box 520). According to one aspect of the present disclosure, the receiving features of box 520 may be implemented with the command/address input circuit 105, as illustrated in FIG. 1 in greater detail, above. The method further includes sending the enable signal to the memory device at a second time subsequent to the first time (box 530). According to one aspect of the present disclosure, the sending features of box 530 may be implemented with the RCD 203, as illustrated in FIG. 2 in greater detail, above. The method further includes sending the command/address signal to the memory device at a third time subsequent to the second time (box 540). According to one aspect of the present disclosure, the sending features of box 540 may be implemented with the RCD 203, as illustrated in FIG. 2 in greater detail, above.

FIG. 6 is a flow chart illustrating a method of operating a memory device in accordance with an embodiment of the present technology. The method includes disabling circuitry of a memory device in response to determining that the memory device is idle (box 610). According to one aspect of the present disclosure, the disabling features of box 610 may be implemented with the command/address input circuit 105 and input buffer 107, as illustrated in FIG. 1 in greater detail, above. The method further includes receiving an enable signal at the memory device (box 620). According to one aspect of the present disclosure, the receiving features of box 620 may be implemented with command/address input circuit 105, as illustrated in FIG. 1 in greater detail, above. The method further includes re-enabling the disabled circuitry in response to receiving the enable signal (box 630). According to one aspect of the present disclosure, the re-enabling features of box 630 may be implemented with command/address input circuit 105 and input buffer 107, as illustrated in FIG. 1 in greater detail, above. The method further includes receiving a command/address signal corresponding to the enable signal subsequent to re-enabling the previously-disabled circuitry (box 640). According to one aspect of the present disclosure, the receiving features of box 660 may be implemented with command/address input circuit 105, as illustrated in FIG. 1 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:
1. A method comprising:
receiving, from a host at a component of a memory module, an indication of a duration corresponding to enabling an input buffer of a memory device of a memory module;

writing, to a mode register of the component or of the memory device, a value corresponding to the indication;

reducing, in response to receiving the indication of the duration, a programmable latency of the memory device by an amount corresponding to the duration;

receiving, from the host at the component of the memory module at a first time, an enable signal for the memory device of the memory module;

receiving, from the host at the component at the first time, a command/address signal for the memory device;

reading, from the mode register, the value to determine the duration;

sending the enable signal from the component to the memory device at a second time subsequent to the first time;

enabling a disabled input buffer of the memory device in response to detecting the enable signal sent to the memory device at the second time; and sending the command/address signal from the component to the memory device at a third time subsequent to the second time by a delay corresponding to the duration.

2. The method of claim 1, wherein the delay corresponds to a number of clock cycles of the memory device.

3. The method of claim 1, wherein receiving the enable signal for the memory device at the component of the memory module comprises receiving the enable signal at a registering clock driver (RCD) of the memory module.

4. The method of claim 1, wherein receiving the command/address signal for the memory device at the component of the memory module comprises receiving the command/address signal at a registering clock driver (RCD) of the memory module.

5. The method of claim 1, wherein sending the enable signal from the component at the second time comprises sending the enable signal from a registering clock driver (RCD) of the memory module to the memory device.

6. The method of claim 1, wherein sending the command/address signal from the component at the third time comprises:

delaying the command/address signal for a number of clock cycles of the memory device corresponding to the determined delay; and sending the command/address signal from a registering clock driver (RCD) of the memory module to the memory device.

7. The method of claim 1, wherein enabling the disabled input buffer is complete before the third time.

8. The method of claim 1, wherein the enable signal is a chip select (CS) signal.

9. A memory module, comprising:

a memory device; and a registering clock driver (RCD) coupled to the memory device and configured to:

receive an indication of a duration corresponding to enabling an input buffer of the memory device;

write, to a mode register of the RCD, a value corresponding to the indication;

receive an enable signal and a command/address signal at a first time, read, from the mode register, the value to determine the duration;

send the enable signal to the memory device at a second time subsequent to the first time, and send the command/address signal to the memory device at a third time subsequent to the second time by a delay corresponding to the duration, wherein the memory device is configured to:

reduce, in response to the RCD receiving the indication of the duration, a programmable latency of the memory device by an amount corresponding to the duration;

disable an input buffer of the memory device in response to a determination that the memory device is idle, and re-enable the disabled input buffer in response to detecting the enable signal sent to the memory device at the second time.

10. The memory module of claim 9, wherein the delay corresponds to a number of clock cycles of the memory device.

11. The memory module of claim 9, wherein the memory device is configured to complete re-enabling the disabled input buffer before the third time.

12. The memory module of claim 9, wherein the memory device comprises a dynamic random access memory (DRAM) device.

13. The memory module of claim 9, wherein the memory module comprises a dual in-line memory module (DIMM).

* * * * *